(12) United States Patent
Imai

(10) Patent No.: US 8,199,273 B2
(45) Date of Patent: Jun. 12, 2012

(54) ARRAY SUBSTRATE FOR FLAT-PANEL DISPLAY DEVICE AND ITS MANUFACTURING METHOD

(75) Inventor: Nobuo Imai, Saitama (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 958 days.

(21) Appl. No.: 12/200,609

(22) Filed: Aug. 28, 2008

(65) Prior Publication Data
US 2009/0058764 A1    Mar. 5, 2009

(30) Foreign Application Priority Data
Aug. 31, 2007 (JP) ................. 2007-225454

(51) Int. Cl.
G02F 1/1333 (2006.01)
G02F 1/1343 (2006.01)
(52) U.S. Cl. ............................. 349/54; 349/55; 349/192
(58) Field of Classification Search ............. 349/54–55, 349/192
See application file for complete search history.

(56) References Cited

U.S. PATENT DOCUMENTS
2007/0158655 A1 * 7/2007 Lin ................................ 257/72

FOREIGN PATENT DOCUMENTS
| JP | 5-66416 | 3/1993 |
| JP | 11-260819 | 9/1999 |
| JP | 2003-280021 | 10/2003 |
| WO | WO 03/081329 A1 | 10/2003 |

* cited by examiner

Primary Examiner — Nathanael R Briggs
(74) Attorney, Agent, or Firm — Finnegan, Henderson, Farabow, Garrett & Dunner, L.L.P.

(57) ABSTRACT

An array substrate comprising: a first insulator film arranged to insulate scanning and control lines from signal lines; switching elements, each of which is arranged in vicinity of respective intersection of the scanning and signal lines; a second insulator film that covers a multi-layer wiring pattern including the scanning and control lines and the signal lines; pixel electrodes, each of which is electrically connected to respective one of the signal lines through the respective switching element; island metal patterns, each of which is arranged to at least partly overlap the control line and is electrically connected with the respective switching element; a wiring breakage that separates one of the signal lines into two wiring parts; and bridge wirings, which connect said two wiring parts by way of one of the island metal patterns and are arranged to overlap the pixel electrodes as interposed by the second insulator film therebetween.

8 Claims, 4 Drawing Sheets

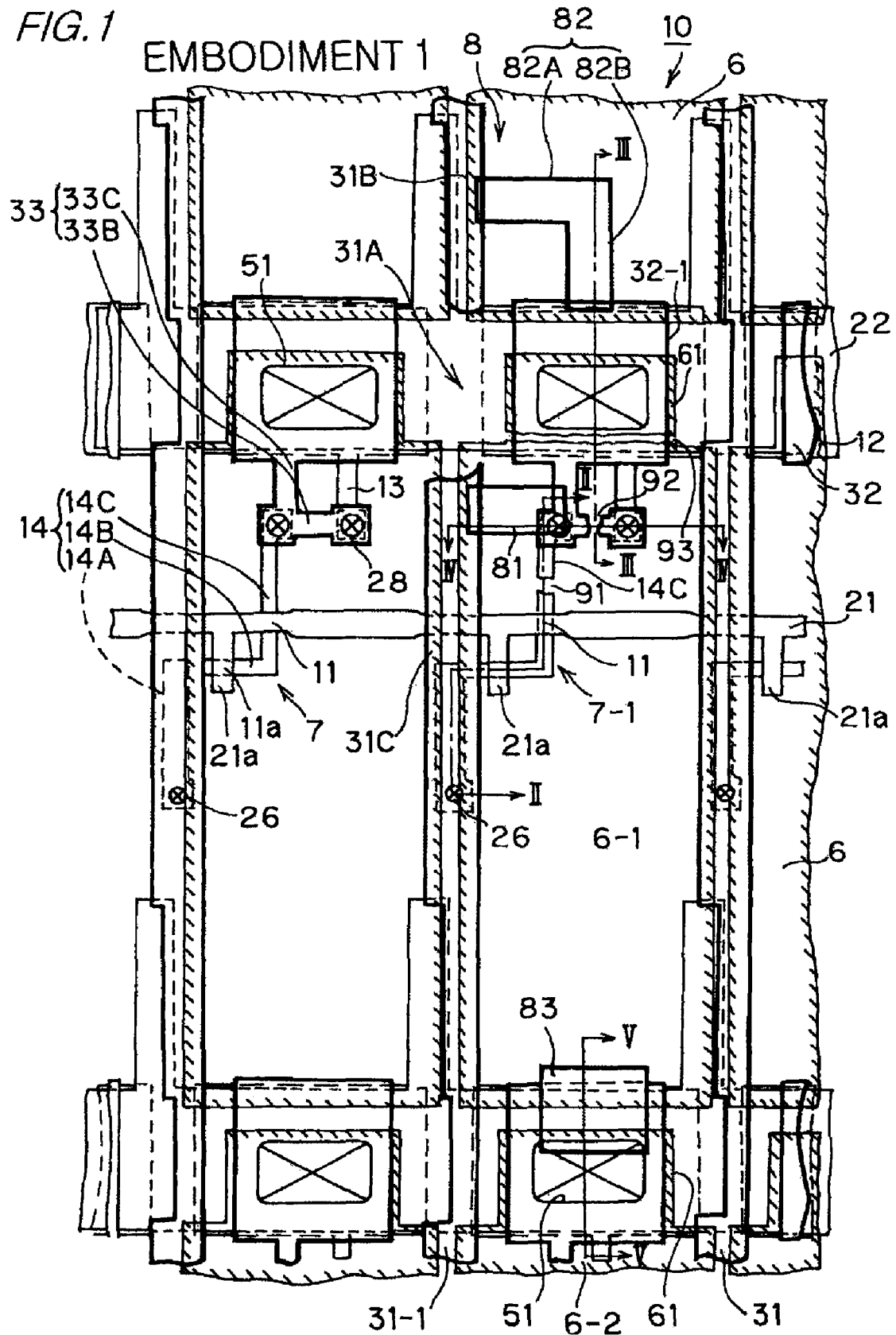
FIG.1 EMBODIMENT 1

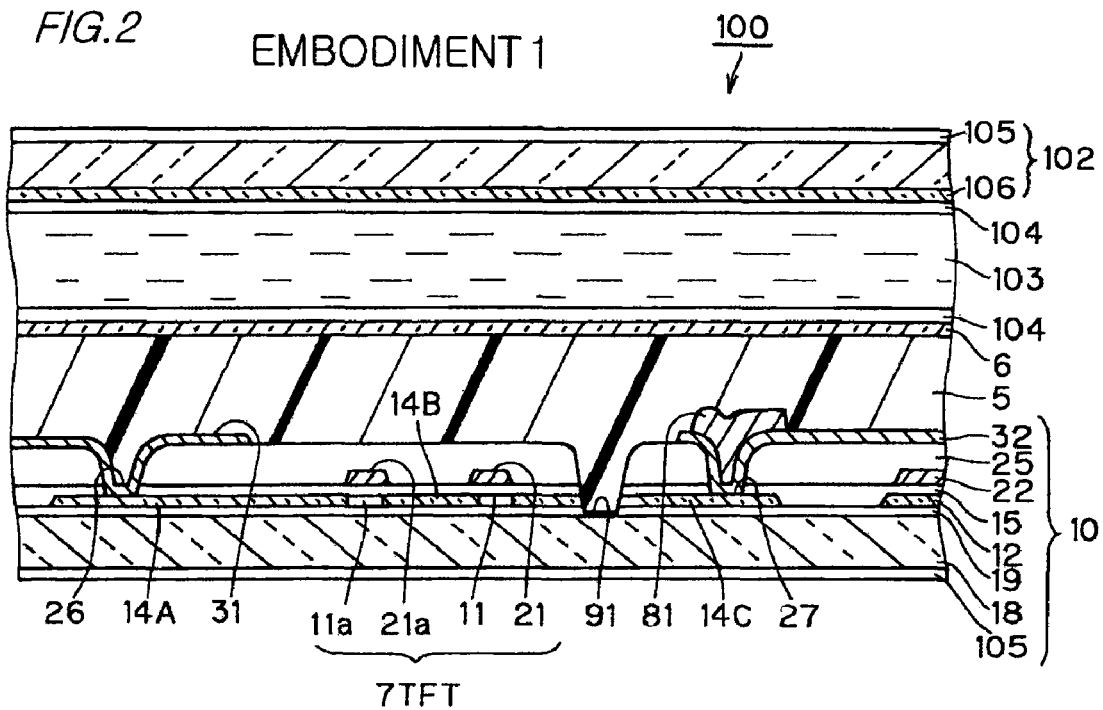
FIG.2 EMBODIMENT 1
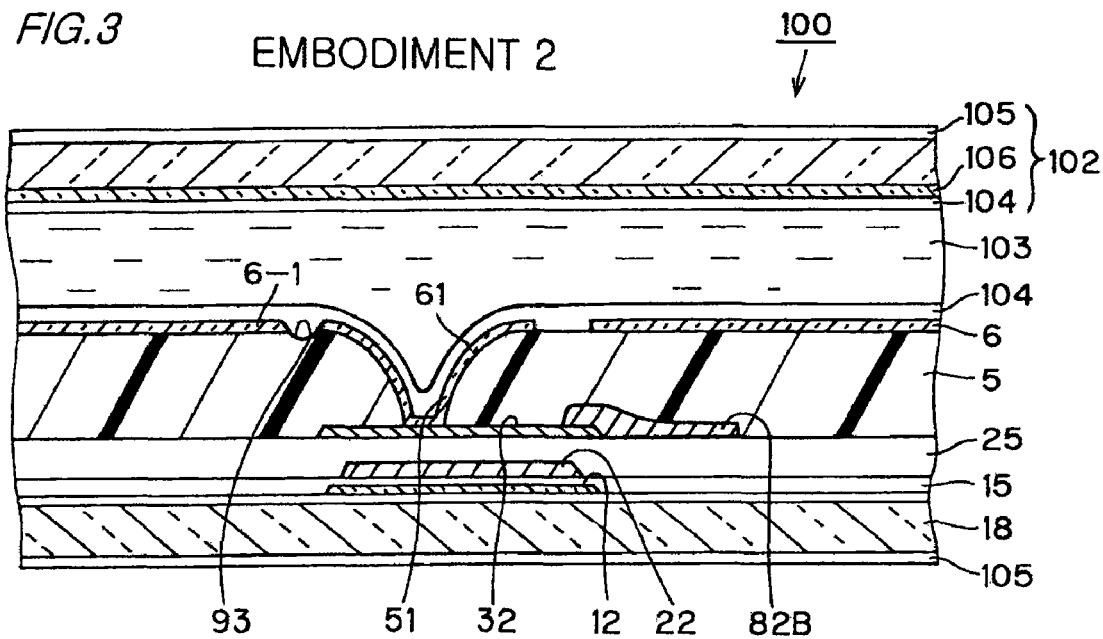
FIG.3 EMBODIMENT 2

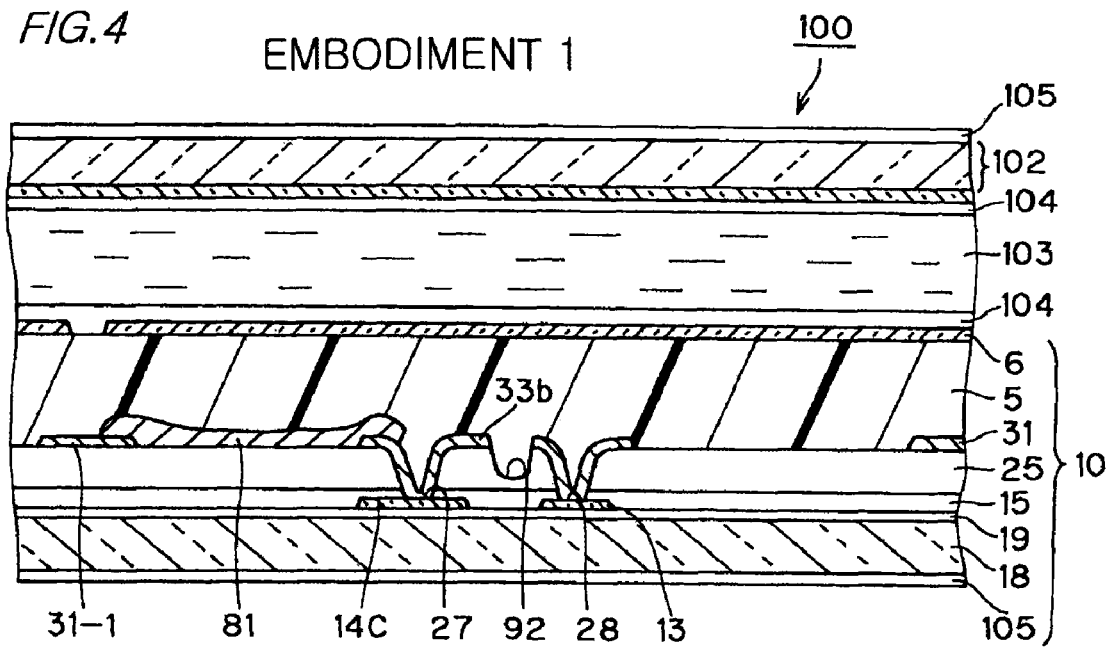
FIG.4 EMBODIMENT 1
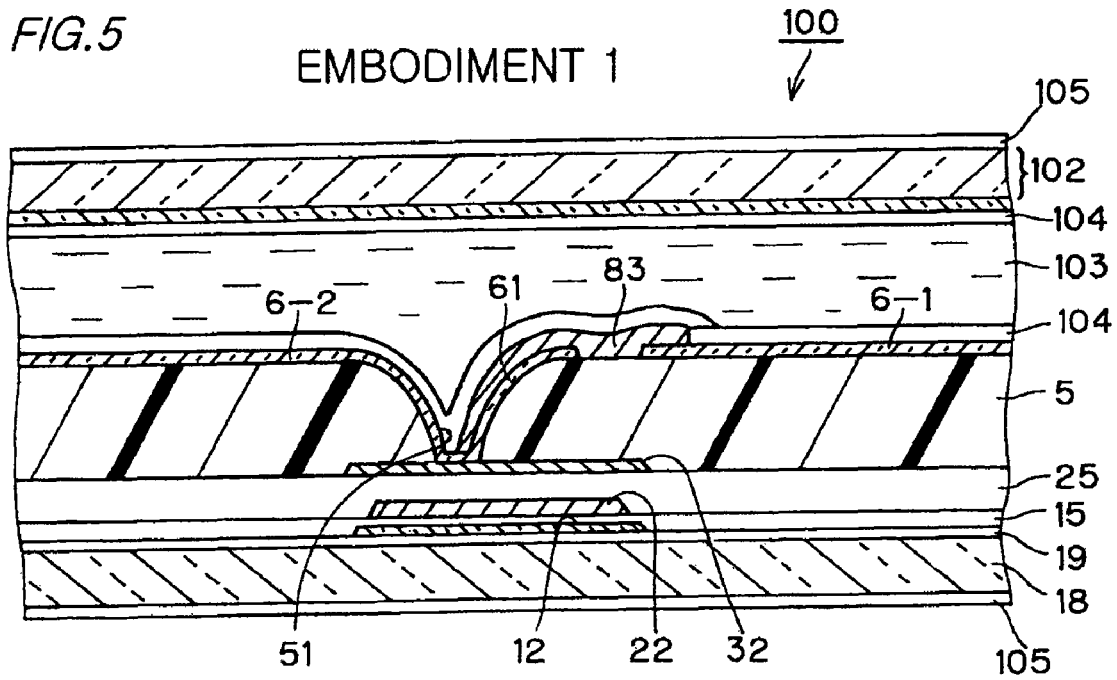
FIG.5 EMBODIMENT 1

ARRAY SUBSTRATE FOR FLAT-PANEL DISPLAY DEVICE AND ITS MANUFACTURING METHOD

CROSS-REFERENCE TO RELATED APPLICATION

This application is based upon and claims the benefit of priority from the prior Japanese Patent Application No. 2007-225454, filed on Aug. 31, 2007; the entire contents of which are incorporated herein by reference.

FIELD OF THE INVENTION

This invention relates to an array substrate used in a flat-panel display device, as typified by a liquid-crystal display (LCD) device and Organic Electro-Luminescence (OEL or OLED) display device, and a manufacturing method of the array substrate. The invention particularly relates to the array substrate having been undergone repairing of wire breakage as to curb a line defect on a screen, which would be caused by a wire breakage in a pixel-array area.

BACKGROUND ART

Recently, liquid crystal display devices and other flat-panel display devices are used in various fields as image display devices for personal computers, word processor-dedicated machines, television set or the like as well as for a projector display device; in view of their small depth dimension and small weight as well as small electric power consumption.

Active-matrix liquid crystal display (active-matrix LCD) devices in particular, which has pixel-switching elements arranged on each display pixel electrode, enables to achieve good image quality without crosstalk between adjacent pixels. Because of these features, active-matrix LCD devices are being earnestly investigated and developed.

In following, a light transmissive one of the active-matrix LCD devices is exemplified for explaining its construction.

An active-matrix LCD device is comprised of a matrix array substrate (hereinafter referred as array substrate) and a counter substrate, which are closely opposed to each other with a predetermined gap, and of a liquid crystal layer held in the gap.

The array substrate has signal lines and scanning lines, which are arranged in a matrix form on an insulator substrate such as a glass plate, and are overlapped to sandwich an insulator film. On each rectangular patch defined by the signal and scanning lines, a pixel electrode is disposed and formed of a transparent electro-conductive material such as Indium-doped tin oxide (ITO). At around each crossing of the signal and scanning lines, a pixel-switching element is disposed for controlling a respective pixel electrode. When the pixel-switching element is a thin film transistor (TFT), gate and signal electrodes of the TFT are respectively connected with scanning and signal lines; and a source electrode of the TFT is connected with a pixel electrode.

The counter substrate has a counter electrode formed of a transparent electro-conductive material such as indium-doped tin oxide (ITO), on an insulator substrate such as a glass plate. When to realize color display, color filter layers are formed on the array or counter substrate.

In manufacturing of such array substrate, foreign particles might occasionally adhere on a film at a time of forming the film for wiring patterns; and a pin hole might occasionally be formed on resist pattern due to the foreign particles or the like at a time of coating the resist resin or of lithographic exposure. Resultantly, a wire breakage might be formed on any of the signal or scanning lines. Such wire breakage causes a line defect on the screen, and thus may cause a decrease in a ratio of shippable goods among whole of products. Thus, various ways for repairing the wire breakage has been adopted in trials. For example, JP1999 (H11)-260819A (Japan's Kokai or patent application publication No. H11-260819) shows a method of forming a repairing wire pattern by applying of positive or negative photoresist resin and a spot exposure for its patterning. Such method requires a series of processes including a layer formation and a patterning; and thus repairing processes are complicated and sufficient decrease of the repairing is not achievable.

JP1993(H05)-066416A (Japan's Kokai or patent application publication No. H05-066416) proposes using of a laser CVD technique in repairing the wire breakage by a simple process. Contact holes are formed in places sandwiching the wire breakage, and then a repair pattern is formed by the laser CVD as to cover an area of the wire breakage and run in a direction of a wire having the wire breakage. This method is not applicable when laser irradiation causes deterioration in a layer at underneath, such as an alteration in nature of a semiconductor layer. This method has a further drawback in that the repair pattern is susceptible to short circuiting with neighboring pixel electrodes, when to repair a wire breakage on a signal line for example. This is due to diffusion of laser beams and metals, which causes a certain thin metal layer around an intended area for forming the repair pattern and thereby causes short-circuiting with nearby pattern of conductive layer.

In view of the above, some methods of forming a bypass wiring that detours a vicinity of the wire breakage have been proposed, by WO03/081329 and JP-2003-280021A (Japan's patent application publication No. 2003-280021) for example. WO03/081329 proposes forming a cut-out on a pixel electrode in vicinity of the wire breakage after forming the pair of contact holes on wiring portions sandwiching the wire breakage; and then, arranging the bypass wiring within the cut-out. Meanwhile, JP-2003-280021A proposes forming, by use of the CVD technique, a pair of bridge wirings that extend from wiring portions sandwiching the wire breakage to a pixel electrode in vicinity of the wire breakage, so as to form a kind of a bypass wiring formed of the pixel electrode and the pair of bridge wirings. In this method, the pixel electrode forming the bypass wiring is cut out from an electrode of the TFT; and the pair of contact holes is also formed on the wiring portions sandwiching the wire breakage. These conventional methods of repairing the wire breakage have a drawback in that unwanted short circuiting might be made between the repair pattern and neighboring pixel electrode because it is necessary to form the pair of contact holes by laser cutting and then form the bypass wiring.

In view of the above drawback, it is aimed to curb the unwanted short circuiting and facilitate the repairing, in manufacturing of the array substrate for display device.

BRIEF SUMMARY OF THE INVENTION

An array substrate of an aspect of the invention is comprised of: a plurality of scanning lines and control lines substantially in a parallel arrangement; a plurality of signal lines that are arranged perpendicularly to the scanning and control lines, with a first insulator film arranged to insulate the scanning and control lines from the signal lines; switching elements, each of which is arranged in vicinity of respective intersection of the scanning and signal lines and has an electrode terminal electrically connected with respective one of the signal lines; a second insulator film that covers a multi-layer wiring pattern including the scanning and control lines and the signal lines; pixel electrodes, which are arranged in a matrix form and each of which is electrically connected to another electrode terminal of the respective switching element; island metal patterns, each of which is arranged to at least partly overlap the control line and is electrically connected with said another electrode terminal of the respective switching element; a wiring breakage that separates one of the signal lines into two wiring parts; and bridge wirings, which connect said two wiring parts by way of one of the island metal patterns and are arranged to overlap the pixel electrodes as interposed by the second insulator film therebetween.

A manufacturing method of an array substrate according to an aspect of the invention, is comprised of: forming a multi-layer wiring pattern that include; a plurality of scanning lines and control lines substantially in a parallel arrangement; a plurality of signal lines that are arranged perpendicularly to the scanning and control lines, with a first insulator film arranged to insulate the scanning and control lines from the signal lines; switching elements, each of which is arranged in vicinity of respective intersection of the scanning and signal lines and has an electrode terminal electrically connected with respective one of the signal lines; and island metal patterns, each of which is arranged to at least partly overlap the control line and is electrically connected with said another electrode terminal of the respective switching element; forming a second insulator film that covers the multi-layer wiring pattern; forming pixel electrodes on the second insulator film, which are arranged in a matrix form and each of which is electrically connected to another electrode terminal of the respective switching element; and checking of electrical continuity of each of the signal lines before forming the second insulator film, to find out a wiring breakage that separate one of the signal lines into two wiring parts; and forming first and second bridge wirings that run respectively from said wiring parts to one of the island metal patterns, which is adjacent to the wire breakage, if and when the wire breakage is found out at said checking.

By the above, repairing of wire breakage on any of the signal lines is easily made even if the wiring breakage is positioned to be prone to make short circuiting with an adjacent pixel electrode.

BRIEF DESCRIPTION OF THE DRAWING

FIG. 1 is a plan view showing a construction of each pixel dot on an array substrate of first embodiment;

FIG. 2 is a sectional view of the array substrate of the first embodiment, schematically showing multi-layer structure at a TFT and wiring patterns connected to the TFT;

FIG. 3 is a sectional view of the array substrate of the first embodiment, schematically showing multi-layer structure at a plane intersecting a second bridge wiring, an island metal pattern and a storage capacitor line;

FIG. 4 is a sectional view of the array substrate of the first embodiment, schematically showing multi-layer structure at a plane intersecting a signal line, a first bridge wiring and two contact holes;

FIG. 5 is a sectional view of the array substrate of the first embodiment, schematically showing multi-layer structure at a plane intersecting a third bridge wiring, a island metal pattern and a storage capacitor line.

DETAILED DESCRIPTION OF THE INVENTION

First Embodiment

Figure 6:
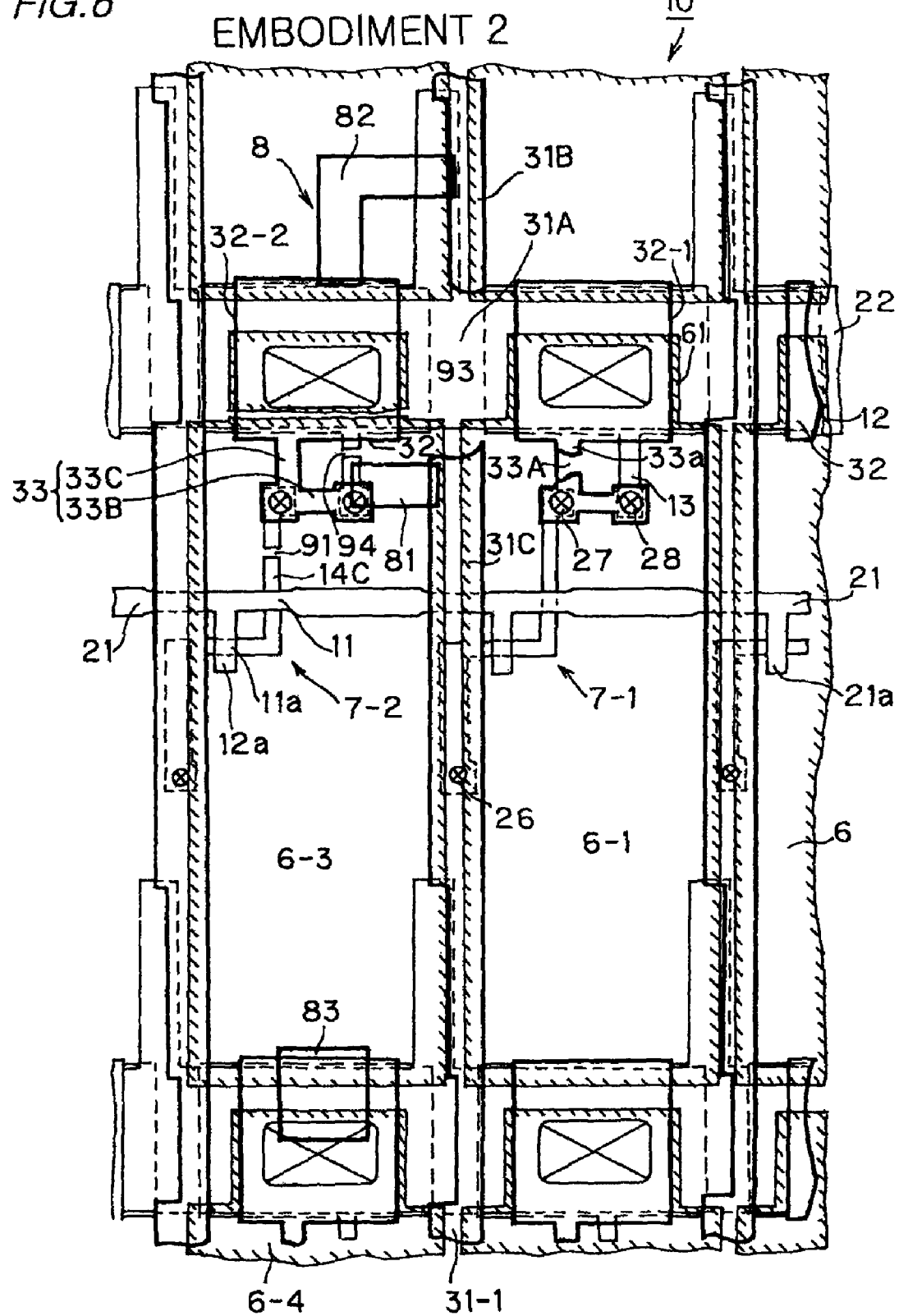
FIG. 6 a plan view corresponding to FIG. 1, showing a construction of each pixel dot on an array substrate of second embodiment.

An array substrate and its manufacturing method of first embodiment of the invention will be described with reference to FIGS. 1 through 5. Exemplified in following explanation is an array substrate for a transmission liquid crystal display device, which has poly-crystalline silicone (p-Si: to be referred as polysilicone) TFTs for respective pixel electrodes as switching elements. The explanation is made for a case where a wire breakage 31A of one of signal lines 31 is occurred in a position at which the one signal line 31 crosses over a storage capacitor line 22, due to a foreign particle or the like at a time of lithographic exposure for forming a resist pattern, and is repaired.

FIG. 1 shows a construction of each pixel dot on the array substrate. Scanning lines 21 perpendicularly intersect signal lines 31 as to form a matrix or lattice form; and a TFT 7 is formed on each intersection of the scanning and signal lines. A storage capacitor (Cs) line 22 having a relatively large width is arranged along and in vicinity of each of the scanning lines 21; and a pixel electrode 31 having a substantially rectangular shape is arranged in a matrix form as to substantially match each pixel-dot aperture that is a rectangular patch defined by the signal lines 31 and the storage capacitor lines 22. All-around fringe of the each pixel electrode overlaps, at its every side of the rectangular shape, with a fringe portion of any of the signal lines 31 and the storage capacitor lines 22, as to enhance aperture ratio or an areal ratio of the pixel-dot aperture to each pixel-dot area.

On first hand, construction on each pixel dot is explained other than pixel dots having a repaired portion. The each pixel electrode 6 has a pixe-electrode extension 51 that is extended from a center part of a fringe of the pixel electrode 6 in which; the fringe overlaps the storage capacitor line 12 in vicinity of a TFT 7 associated with the very pixel electrode 6; the center part of the fringe is major part of the fringe as distanced from the signal lines 31; and the pixe-electrode extension 51 overreaches a center line of the storage capacitor line 12. The pixe-electrode extension 61 and the metal island pattern 32, which is nearer to bottom, overlap with each other as to sandwich a thick resin film 5 between them; and are electrically connected with each other by way of a contact hole 51 perforating the thick resin film 5. Each of the metal island patterns 32 has an L-shaped extension 33, which stretches into inner and non-fringe part of a pixel-dot aperture and is formed of; a proximal linear part 33C that runs in a direction of the signal lines 31; and a distal linear part 33B that runs from end of the proximal linear part 33C as turned into a direction of the scanning lines 21 as to stretch away from the TFT 7. The L-shaped extension 33 has, at its turning point or its angled portion, a contact hole 27 perforating an interlayer insulator film 25 and gate insulator film 15; and is electrically connected with a source electrode of the TFT 7 by way of the contact hole 27 and a polysilicone wiring 14C. Thus, the pixel electrode 6 is electrically connected with the source electrode of the TFT 7 by way of the metal island pattern 32 and the polysilicone wiring 14C.

Drain electrode of the TFT 7 is electrically connected with the signal line 31 by way of a polysilicone wiring 14A and a contact hole 26, which perforates the gate and interlayer insulator films 15, 25 at within a contour of the signal line 31.

In an illustrated example, the contact hole 26 is positioned as spaced apart from the TFT 7; and the polysilicone wiring 14A runs along the signal line 31 toward a nearest one of the scanning lines 21 and then turned into the direction of the scanning lines 21. In each of the TFTs 7, which is of a top-gate construction as shown in FIGS. 1-2, two gate electrodes respectively formed of the scanning line 21 itself and its branch 21a are intersected with a polysilicone wiring 14. Channel regions of the TFTs are formed at portions overlapping the gate electrodes, within a contour of the polysilicone wiring 14. The polysilicone wiring 14 is formed of; the polysilicone wirings 14A and 14C; as well as a polysilicone wiring 14B that is interposed between two channel regions 11 and 11a. A polysilicone island pattern 12 in a rectangular shape is arranged to be nearly congruent with each segment, of the storage capacitor line 22, sandwiched by the signal lines 31. Each of the polysilicone island patterns 12 overlaps the storage capacitor line 22 as to sandwich the gate insulator film 15, and has a linear extension 13 extended into the pixel-dot aperture, toward its inner area. As shown in FIG. 1, a distal end of the linear extension 13 is overlapped and electrically connected with a distal end of the L-shaped extension 33 of the metal island pattern 32, by way of a contact hole 28 perforating the gate and interlayer insulator films 15 and 25. Thus, the polysilicone island pattern 12 is electrically connected with the pixel electrode 6 by way of the metal island pattern 32 and serves for forming a storage capacitor for the pixel electrode 6, in same manner as and in addition to that formed by the metal island pattern 32.

Meanwhile, a color filter is formed by and within the thick resin film 5, which is often referred as a flattening film, on the array substrate 10. A pattern of light-shielding film, which is often referred as "black matrix", is not formed within a pixel-array area, on neither of the array and counter substrates, and is arranged only at between all-around fringe of the pixel-array area and a pattern of sealing material. As shown in FIGS. 2-5, a counter electrode 106 is formed on almost whole area of inward-coming face of the counter substrate 102; the array and counter substrates 10 and 102 are joined to each other as to sandwich spacers and the sealing material arranged on all-around fringe portion of the substrates. On beforehand of such joining, alignment layers 104 are formed on inward-coming faces, which are to contact with the liquid crystal layer, of the array and counter substrates 10 and 102. On outward faces of the array and counter substrates 10 and 102, polarizer sheets 105 are attached.

In following, a construction of repaired part is explained. In a detailed embodiment, the signal lines 31 and the metal island patterns 32 are formed on first hand on the array substrate 10, by metal layer such as aluminum; and then, a wire breakage and/or a short circuiting is detected by a known method such as using an array tester. As a more simple way, probes or other terminals may be contacted on both ends of each of the signal lines 31 as to check continuity of the signal lines 31. It is assumed that a wire breakage 31A of one of the signal lines 31 is detected on its intersection with the storage capacitor line 22, as shown in FIG. 1. In such occasion, a bypass wiring 8, which detours the wire breakage 31A and connects two wiring parts 31B and 31C of the signal line 31, is formed by the metal island pattern 32 and first and second bridge wirings 81 and 82. The bridge wirings 81 and 82 are formed by laser CVD technique, after forming of the signal lines 31 and the metal island patterns 32 and on beforehand of applying of a resin for the thick resin film 5 that covers the signal lines 31 and the metal island patterns 32. Thus, no short circuiting is occurred between the pixel electrode 6 and the bridge wirings 81 and 82. The bridge wirings 81 and 82 are directly covers upper surfaces of the signal lines 31 and the metal island patterns 32 as to be electrically connected with them without using any contact hole.

In the first embodiment, the bypass wiring 8 is formed by using the metal island pattern 32-1, which has been connected with the signal line 31-1 having the wire breakage 31A by way of the TFT 7-1, among two of the metal island patterns 32-1 and 32-2 that are adjacent to the wire breakage 31A. In the illustrated example, the first bridge wiring 81 is linear and in parallel with the storage capacitor line 22, as to extend from an end of the wiring part 31C of the signal line 31-1 to the angled part having the contact hole 27, of the L-shaped extension 33 of the metal island pattern 32-1. The second bridge wiring 82 is of L-shaped and consisting of; a first linear wiring part 82A that extends in parallel with the storage capacitor line 22, from the other wiring part 31B of the signal line 31-1; and a second linear wiring part 82B that extends from an end of the first linear wiring part 82A as turned to be in parallel with the signal line 31 to reach a fringe portion of the metal island pattern 31-1. Alternatively, the second bridge wiring 82 may be shaped as an arch consisting of smooth curve, and may be linear. The first bridge wiring 81 might be formed in various shapes such as an L shape in a manner as the second bridge wiring 83. As shown in FIG. 3 and FIG. 1, the second bridge wiring 82 directly covers and overlaps a portion of a fringe of the metal island pattern 32-1; and in vicinity of such overlapping, a fringe of the polysilicone island pattern 12 at underneath of the second bridge wiring 83 is surely covered by the fringe portion of the metal island pattern 32. In other words, the fringe of the polysilicone metal pattern 12 is designed to come inward of the fringe of the metal island pattern 3, as distanced by a margin of alignment between two patterning processes respectively for the island patterns 12,32. Thus, polysilicone layer of the polysilicone island pattern 12 would not undergo deterioration or alteration, during laser CVD process. Moreover, no short circuiting is occurred with molybdenum-tungsten (Mo—W) layer of the storage capacitor line 22.

Laser-cut disconnections 91 and 92 are formed by laser evaporation technique at a stage forming the first and second bridge wiring 81 and 82, that is; after forming of the signal lines 31 and the metal island patterns 32 and before coating of resin for forming the thick resin film 5 that covers these metal patterns. Firstly, as shown in FIGS. 1-2, an electric connection from TFT 7 to the metal island pattern 32 is severed by cutting the polysilicone wiring 14C to form a laser-cut disconnection 91. Then, as shown in FIG. 1 and FIG. 4, electric connection from the polysilicone island pattern 12 to the metal island pattern 32 is severed by cutting the L-shaped extension 33 of the metal island pattern 32 at a position slightly distanced from the end of the L-shaped extension 33, to form a laser-cut disconnection 92.

Meanwhile, as shown in FIG. 1 and FIG. 3, the pixel electrode 6-1 having been disconnected from the TFT 7-1 for the repairing is subjected to laser cutting as to separate the pixel-electrode extension 61 from other part of the pixel electrode 6-1 and to cut through base part of the pixel-electrode extension 61, to form a laser-cut disconnection 93. The laser-cut disconnection 93 is to cut out, from the pixel electrode 6-1, its portion contacted with the metal island pattern 32; and thereby sever an electric connection from the pixel electrode 6-1, through the metal island pattern 32 and the first and second bridge wirings 81 and 82, to the signal line 31.

Further, as shown in FIG. 1 and FIG. 5, the pixel electrode 6-1 is electrically connected with the next pixel electrode 6-2 through third bridge wiring 83. The third bridge wiring 83 is formed by laser CVD in a manner as in above, almost simultaneously with forming the laser-cut disconnection 93.

In following, a manufacturing process of the array substrate in this embodiment is explained in detail by way of an example.

<1> First patterning: Firstly, by use of plasma CVD technique, a silicone oxide film and a silicone nitride film are deposited on a glass substrate 18 that appears in FIG. 2, as to form a two-layer film that is an undercoat layer 19 for curbing proliferation of impurity. Subsequently, by use of the plasma CVD technique, an amorphous silicone film of 50 nm thickness is deposited. Then, the glass substrate 18 is placed in a furnace so that the amorphous silicone film is subjected to a dehydrogenation process. Thereafter, melting and crystallization of the silicone film is achieved by that; whole face of the silicone film is irradiated, with excimer laser light for example. Thus obtained polysilicone film is subjected to a patterning as to form; semiconductor layers for the TFTs 7; and the polysilicone wirings 14; the polysilicone island patterns 12 arranged to overlap the storage capacitor lines 22.

<2> Second patterning: The plasma CVD technique is used to form a gate insulator film 15 of 100 nm thickness consisting of single layer of silicone oxide. Subsequently, a sputtering technique is used to deposit a molybdenum-tungsten alloy film (Mo—W film) of 300 nm thickness for example. Then, a patterning is made to form the scanning lines 21 in number of 768, their branches 21a, and storage capacitor lines 22 in the same number.

<3> Third patterning: By use of the scanning lines 21 and their branches 21a as a photomask pattern, certain parts of the polysilicone wiring 14 are doped with impurity materials or doping agents by using an ion implanter of amorphous separating type. Thus, the channel regions 11 and 11a are formed at portions where the polysilicone wirings 14 are overlapped with the gate electrodes 21 and 21a. Such TFTs of coplanar configuration may be formed in detail by a method disclosed in JP-2001-339070A for example.

<4> Fourth patterning: The CVD technique is used to form an interlayer insulator film 25 consisting of a silicone oxide film in thickness of 600 nm. Then, a patterning is made to form contact holes 26 for electrically connecting the signal lines 31 with the polysilicone wirings 14. Simultaneously formed are contact holes 27 and 28 which expose, within an each area to be disposed of the L-shaped extension 33 of the metal island pattern 33; an end portion of each of the polysilicone wirings 14; and distal end portion of each of the linear extensions 13 of the island polysilicone pattern 12. Although not illustrated in the drawings, also formed are contact holes for exposing terminal pads on peripheral portions of the substrate, at surroundings of the pixel-array area.

<5> Fifth patterning: The sputtering technique is used to deposit a molybdenum-aluminum-molybdenum three-layer metal film (Mo/Al/Mo film) for example, in which an aluminum metal layer is sandwiched by top and bottom molybdenum (Mo) layers. For example, a Mo layer of 25 nm thickness, and aluminum (AL) layer of 250 nm thickness and a Mo layer of 50 nm thickness are sequentially deposited in this order. A patterning is made on the three-layer metal film as to form the signal lines 31 in number of 1024×24 as well as the island metal patterns 32.

<6> Continuity test and First part of repairing: Probes are contacted on the terminal pads of each of; the signal lines 31, each of the scanning lines 21 and each of the storage capacitor lines 22; as to detect a wire breakage and/or a short circuiting between wirings. When the wire breakage 31A of one of the signal lines 31 is found at a position other than crossing of the signal line 31 over the storage capacitor line 22; then, the wire breakage 31A is repaired by simply connecting two wiring parts of the one signal line 31, with laser CVD technique. When the wire breakage 31A of one of the signal lines 31 is found at crossing of the one signal line 31-1 over the storage capacitor line 22; then, first and second bridge wirings 81 and 82 are formed by laser CVD technique, as to be extended from ends of wiring parts 31B and 31C sandwiching the wire breakage 31A, of the one signal line 31, to reach one of the metal island patterns 32, which is adjacent to the wire breakage 31A.

Subsequently, the polysilicone wiring 14 is cut by laser cutting, at the wiring part 14C between the scanning line 21 and the contact hole 27. In detail, the wiring part 14C is severed to form a laser-cut disconnection 91 at its certain position, as appeared in FIG. 1 and FIG. 3; by applying laser evaporation technique or zapping technique in a manner to remove the gate and interlayer insulator films 15 and 25 as well as the polysilicone layer of the wiring part 14C at the certain position. Meanwhile, the L-shaped extension 33 of the metal island pattern 32 is severed at a position slightly distanced from distal end of the extension 33, by laser cutting as in cutting of the wiring part 14C. In detail, distal linear wiring part 33B is severed to form a laser-cut disconnection 92 at vicinity of its center or of a middle point between the contact holes 27 and 28; by applying the laser evaporation technique in a manner to completely remove the three-layer metal film (Mo/Al/Mo film).

<7> Sixth patterning: With respect to each color of red, blue and green, the substrate is uniformly coated with a light-curing resin liquid, which is formed of a colored acrylic resin or the like, at a thickness of 2 μm. This is followed by a series of processing, which includes a light exposure process by use of a photomask as to form the thick resin film 5, which has color patterns in stripe arrangement is formed and in which each color is allotted to a row of the pixel dot apertures. The thick resin film 5 is provided with contact holes 51, each of which is formed during the above-mentioned light exposure process or the like to an area inside of contour of the island metal pattern 32.

Alternatively, the color patterns may be formed by an ink-jet technique as follows. The substrate is uniformly coated with a colorless light-curable resin liquid, which is formed of an acrylic resin or the like, at a thickness of 2 μm. This is followed by a series of processing, which includes a light exposure process by use of a photomask as to form the thick resin film 5. The colorless thick resin film 5 is subjected to prebaking and then to lithographic light exposure and heat treatment in a manner to achieve hydrophobization on center-line parts, widthwise center parts, of the signal lines 31 and the scanning lines 21 so that dye becomes difficult to be absorbed at the center-line parts. Thus curbed is mixing of dyes of different colors at between adjacent pixel dots. Subsequently, the dyes of red (R), blue (B) and green (G) colors are discharged on areas that have not undergone the hydrophobization to achieve coloring. Then, drying and heat treatment is made to achieve complete curing of the resin. In otherwise, curable resin liquid having been dispersed of pigments of each color may be applied on the substrate by the ink-jet technique.

<8> Seventh patterning and Second and last part of repairing: As a transparent conductive layer, ITO layer of 150 nm thickness for example is deposited; and the patterning is made to form pixel electrodes 6 and the pixel-electrode extensions 61, as well as ITO films covering the terminal pads, simultaneously.

As for the pixel electrode 6-1, which has become electrically connected with the one signal line 31-1 at the first part of repairing; following manner of repairing is further made. On first hand, at a pixel dot in which the one metal island pattern 32-1 serves as a part of the bypass wiring 8, the pixel-electrode extension 61 that overlaps the one metal island pattern 32-1 is cut out from other part of the pixel electrode 6-1, by the laser evaporation technique. Namely, the pixel-electrode extension 61 is cut through at its base portion as to cut out almost whole of the pixel-electrode extension 61 from the other part, by removing the ITO film with the laser evaporation technique. Thus formed laser-cut disconnection 93 on the pixel electrode 6 severs an electrical connection from the pixel electrode 6, through the bridge wirings 81 and 82 and the metal island pattern 32, to the signal line 31-1.

Subsequently, a third bridge wiring 83 that electrically connects the one pixel electrode 6-1 having been disconnected from the TFT 7-1, with any one of the pixel electrodes 6 that are adjacent to the one pixel electrode 6-1, by the laser CVD technique. In a preferred embodiment illustrated in the drawings, the one pixel electrode 6-1 is electrically connected with a "prior-row" pixel electrode 6-2; which is next to the one pixel electrode 6-1 in a row along the signal line 3-1 and is positioned on a side opposite to the TFT 7-1 of the one pixel electrode 6-1 and opposite to the bypass wiring 8. Here, it is assumed that polarity between the one and "prior-row" pixel electrodes 6-1 and 6-2 is same and thus, similar signals are inputted to them. Alternatively, the one pixel electrode 6-1 may be connected with other one among the pixel electrodes 6 next to the one pixel electrode 6-1; that is, with one on right-hand side or left-hand side in FIG. 1, or with one on a "latter row" in view of a sequence of applying scanning pulse, unless display visibility of the pixel dot is undermined.

In following, concrete examples on applying of the laser CVD and laser evaporation techniques are described. For depositing a conductive layer by the laser CVD technique, adopted light source of the laser beams is $Nd^{+3}$:YLF and its third harmonic wave at 349 nm is used. When forming the first, second and third bridge wirings 81-83, so as to locally deposit tungsten (W) metal, a tungsten-containing carbonyl compounds such as $W(CO)_6$ is adopted as a source gas while argon (Ar) gas is used as carrier gas. For example, adopted laser beams is of continuous oscillation at energy level of more than 100 mW (4 kHz) as to form metal layer having 0.3 μm thickness. Width of the bridge wirings 81 and 82 is set to become about 5 μm that is almost same with that of the signal lines 31. Using of the tungsten-containing carbonyl compounds as in above concrete example is preferred, because achieved are high efficiency of decomposition and deposition under laser beams as well as excellent stability in film formation. Nevertheless, other source gas such as chrome carbonyl or the like may be used in some occasions. Thus, the bridge wirings 81 and 82 may be formed by chrome or the other metal. Meanwhile, for a carrier gas, argon gas is preferred while nitrogen gas or the like may also be used. Width of the first and second bridge wirings 81 and 82 may be selected from a range of 2-25 μm for example, by adjusting slit width for and energy level of laser beams. Thickness of the bridge wirings 81 and 82 may be selected from a range not more than 1.0 μm according to a situation given arisen.

Meanwhile, when to form the third laser-cut disconnection 93 by removing the ITO film consisting the pixel electrode 5, following laser beams are adopted for example; laser beams are originated from a laser device as in above and being modulated with a ultrasonic Q-switching device; and energy level of the laser beams are in a range of 0.4-0.6 mJ (1-10 Hz). When to remove the insulator films 15 and 25 as well as the polysilicone layer for forming the first laser-cut disconnection 91, laser beams in same as above are used except that energy level exceeds 0.6 mJ (2 Hz). As in the above, the laser device used for forming of the first, second and third bridge wirings 81-83 by the CVD technique is same with that for forming of the first, second and third laser-cut disconnections 91-93 by the laser evaporation technique, as to facilitate repairing processes. When metal depositing by the CVD technique is to be made on or in vicinity of the pixel electrode 6 that is formed of a transparent conductive layer such as ITO, it is preferable to adopt the laser beams in an ultraviolet (UV) range such as the third harmonic wave of $Nd^{+3}$:YLF laser. When the pixel electrode 6 is reflective one formed of a metal layer such as aluminum layer, the second harmonic wave of $Nd^{+3}$:YLF laser may be adopted for depositing metal layer on or in vicinity of the pixel electrode 6. As a source of the laser beams, it is preferable to adopt the YLF laser as in the above concrete example or adopt YAG laser because the above energy level is easily achieved. Carbon dioxide laser or other laser may also be used depending on occasions.

Second Embodiment

Second embodiment of the invention will be explained by use of a plan view of FIG. 6 that corresponds to FIG. 1. This embodiment is to cope with an occasion where not only the wire breakage 31A on the signal line 31 but also a wire breakage 33A on a proximal or base portion of the L-shaped extension 33 are formed. In such occasion, it is easier to arrange the bypass wiring 8 on a side opposite to that of the first embodiment. In other words, instead of using the metal island pattern 32-1 on the pixel dot associated with the one signal line 31-1 having the wire breakage 31A, it is adopted for the bypass wiring 8, the metal island pattern 32-2 on a next pixel dot that is demarcated, by the one signal line 31-1 having the wire breakage 31A, from the pixel dot associated with the one signal line 31-1. In other words, the metal island pattern 32-2 used here has not been supplied with signal from the one signal line 31-1 having the wire breakage 31A; and is another one among the two metal island patterns 32 that are in vicinity of the wire breakage 31A on the one signal line 31-1. Thus, the bypass wiring 8 on the second embodiment is arranged to be in symmetrical about the bypass wiring 8 of the first embodiment. In an example illustrated in FIG. 5, the first bridge wiring 81 is in same manner with that in the first embodiment, and runs linearly in parallel with the storage capacitor line 22, from distal end of the one wiring part 31C of the one signal line 31-1 to a metal layer covering the contact hole 28, which is for connecting with the polysilicone island pattern 12. Thus, whole of the L-shaped extension 33 of the metal island pattern 32-2 serves as part of the bypass wiring 8. For this reason, when to electrically isolate the polysilicone island pattern 12 from the other conductive pattern, the laser-cut disconnection 92 severing the L-shaped extension 33 is not adoptable; and instead of this, a laser-cut disconnection 94 severing the linear extension 13 of the polysilicone island pattern 12 is adopted. In detail, the laser-cut disconnection 94 is formed by cutting through the linear extension 13 with the laser evaporation technique at middle between; a rectangular main part of the polysilicone island pattern 12; and the contact hole 28 that is at the distal end of the linear extension 13.

Other constructions of the second embodiment are in same with those of the first embodiment except that constructions for the repairing is arranged to be symmetrical with those in the first embodiment. For example, as in the first embodiment, the second bridge wiring 82 is L-shaped; and the first laser-cut disconnection 91 is made by the laser evaporation technique in same manner as above, as to disconnect the metal island pattern 32-2 used in the bypass wiring, from the TFT 7-2. And, the pixel-electrode extension 61 overlapping with the metal island pattern 32-2 is severed at basal portion of the extension 61; by the laser evaporation technique in a manner same as in the first embodiment, as to form the laser-cut disconnection 93 between the extension 61 and other part of the pixel electrode 6-3. The pixel electrode 6-3 is electrically connected through the third bridge wiring 83 with "prior-row" pixel electrode 6-4, as in same manner with those in the first embodiment.

In each of the above embodiments and examples, the above explanation is made on that of polysilicone TFTs and used in LCD display device. Nevertheless, repairing constructions same as above is applicable to an array substrate of amorphous silicone TFTs and to an array substrate of amorphous silicone TFTs or polysilicone TFTs for the OEL display device.

What is claimed is:

1. An array substrate for a display device, comprising:
   a plurality of scanning lines and control lines substantially in a parallel arrangement;
   a plurality of signal lines that are arranged perpendicularly to the scanning and control lines, with a first insulator film arranged to insulate the scanning and control lines from the signal lines;
   switching elements, each of which is arranged in a vicinity of a respective intersection of the scanning and signal lines and has a first electrode terminal electrically connected with respective one of the signal lines;
   a second insulator film that covers a multi-layer wiring pattern including the scanning and control lines and the signal lines;
   pixel electrodes, which are arranged in a matrix form and each of which is electrically connected to a second electrode terminal of the respective switching element;
   island metal patterns, each of which is arranged to at least partly overlap the control line and is electrically connected with said second electrode terminal of the respective switching element;
   a wiring breakage that separates one of the signal lines into two wiring parts; and
   bridge wirings, which connect said two wiring parts by way of one of the island metal patterns and are arranged to overlap the pixel electrodes as interposed by the second insulator film therebetween,
   wherein said one of metal island patterns is electrically disconnected from the switching element that is associated with said one of metal island patterns.

2. An array substrate for a display device, comprising:
   a plurality of scanning lines and control lines substantially in a parallel arrangement;
   a plurality of signal lines that are arranged perpendicularly to the scanning and control lines, with a first insulator film arranged to insulate the scanning and control lines from the signal lines;
   switching elements, each of which is arranged in a vicinity of a respective intersection of the scanning and signal lines and has a first electrode terminal electrically connected with respective one of the signal lines;
   a second insulator film that covers a multi-layer wiring pattern including the scanning and control lines and the signal lines
   pixel electrodes, which are arranged in a matrix form and each of which is electrically connected to a second electrode terminal of the respective switching element;
   island metal patterns, each of which is arranged to at least partly overlap the control line and is electrically connected with said second electrode terminal of the respective switching element;
   a wiring breakage that separates one of the signal lines into two wiring parts; and
   bridge wirings, which connect said two wiring parts by way of one of the island metal patterns and are arranged to overlap the pixel electrodes as interposed by the second insulator film therebetween,
   wherein one of the pixel electrodes, which is associated with said one of metal patterns, is electrically disconnected from associated one of the switching elements.

3. The array substrate according to claim 2, wherein one of the pixel electrodes, which is associated with said one of metal patterns, is electrically connected with another of the pixel electrodes.

4. An array substrate for a display device, comprising:
   a plurality of scanning lines and control lines substantially in a parallel arrangement;
   a plurality of signal lines that are arranged perpendicularly to the scanning and control lines, with a first insulator film arranged to insulate the scanning and control lines from the signal lines;
   switching elements, each of which is arranged in a vicinity of a respective intersection of the scanning and signal lines and has a first electrode terminal electrically connected with respective one of the signal lines;
   a second insulator film that covers a multi-layer wiring pattern including the scanning and control lines and the signal lines;
   pixel electrodes, which are arranged in a matrix form and each of which is electrically connected to a second electrode terminal of the respective switching element;
   island metal patterns, each of which is arranged to at least partly overlap the control line and is electrically connected with said second electrode terminal of the respective switching element;
   a wiring breakage that separates one of the signal lines into two wiring parts;
   bridge wirings, which connect said two wiring parts by way of one of the island metal patterns and are arranged to overlap the pixel electrodes as interposed by the second insulator film therebetween; and
   semiconductor island patterns that are arranged at underneath of the control lines, with an insulator film being interposed between the semiconductor island patterns and the control lines, wherein fringes of the semiconductor island patterns are covered by the control lines at least in a vicinity of the bridge wirings.

5. A manufacturing method of an array substrate for a display device, comprising:
   forming a multi-layer wiring pattern that include:
     a plurality of scanning lines and control lines substantially in a parallel arrangement;
     a plurality of signal lines that are arranged perpendicularly to the scanning and control lines, with a first insulator film arranged to insulate the scanning and control lines from the signal lines;
     switching elements, each of which is arranged in a vicinity of a respective intersection of the scanning and signal lines and has a first electrode terminal electrically connected with respective one of the signal lines; and
     island metal patterns, each of which is arranged to at least partly overlap the control line and is electrically connected with a second electrode terminal of the respective switching element;

forming a second insulator film that covers the multi-layer wiring pattern;

forming pixel electrodes on the second insulator film, which are arranged in a matrix form and each of which is electrically connected to the second electrode terminal of the respective switching element;

checking of electrical continuity of each of the signal lines before forming the second insulator film, to find out a wiring breakage that separates one of the signal lines into two wiring parts;

forming first and second bridge wirings that run respectively from said wiring parts to one of the island metal patterns, which is adjacent to the wire breakage, if and when the wire breakage is found out at said checking; and if and when the wire breakage is found out at said checking: electrically disconnecting said one of island metal patterns from associated one of the switching elements, which has been electrically connected with said one of island metal patterns.

6. A manufacturing method of an array substrate for a display device, comprising:

forming a multi-layer wiring pattern that include:
  a plurality of scanning lines and control lines substantially in a parallel arrangement;
  a plurality of signal lines that are arranged perpendicularly to the scanning and control lines, with a first insulator film arranged to insulate the scanning and control lines from the signal lines;
  switching elements, each of which is arranged in a vicinity of a respective intersection of the scanning and signal lines and has a first electrode terminal electrically connected with respective one of the signal lines; and
  island metal patterns, each of which is arranged to at least partly overlap the control line and is electrically connected with a second electrode terminal of the respective switching element;

forming a second insulator film that covers the multi-layer wiring pattern;

forming pixel electrodes on the second insulator film, which are arranged in a matrix form and each of which is electrically connected to the second electrode terminal of the respective switching element;

checking of electrical continuity of each of the signal lines before forming the second insulator film, to find out a wiring breakage that separates one of the signal lines into two wiring parts;

forming first and second bridge wirings that run respectively from said wiring parts to one of the island metal patterns, which is adjacent to the wire breakage, if and when the wire breakage is found out at said checking; and if and when the wire breakage is found out at said checking: electrically disconnecting one of the pixel electrodes, which has been electrically connected with said one of island metal patterns, from associated one of the switching elements, which has been electrically connected with said one of the pixel electrodes.

7. A manufacturing method of an array substrate for a display device, comprising:

forming a multi-layer wiring pattern that include:
  a plurality of scanning lines and control lines substantially in a parallel arrangement;
  a plurality of signal lines that are arranged perpendicularly to the scanning and control lines, with a first insulator film arranged to insulate the scanning and control lines from the signal lines;
  switching elements, each of which is arranged in a vicinity of a respective intersection of the scanning and signal lines and has a first electrode terminal electrically connected with respective one of the signal lines; and
  island metal patterns, each of which is arranged to at least partly overlap the control line and is electrically connected with a second electrode terminal of the respective switching element;

forming a second insulator film that covers the multi-layer wiring pattern;

forming pixel electrodes on the second insulator film, which are arranged in a matrix form and each of which is electrically connected to the second electrode terminal of the respective switching element;

checking of electrical continuity of each of the signal lines before forming the second insulator film, to find out a wiring breakage that separates one of the signal lines into two wiring parts;

forming first and second bridge wirings that run respectively from said wiring parts to one of the island metal patterns, which is adjacent to the wire breakage, if and when the wire breakage is found out at said checking; and if and when the wire breakage is found out at said checking: forming a third bridge wiring that electrically connects one of the pixel electrodes, which has been electrically connected with said one of island metal patterns, with another of the pixel electrodes, which is next to said one of pixel electrodes.

8. A manufacturing method of an array substrate for a display device, comprising:

forming a multi-layer wiring pattern that include:
  a plurality of scanning lines and control lines substantially in a parallel arrangement;
  a plurality of signal lines that are arranged perpendicularly to the scanning and control lines, with a first insulator film arranged to insulate the scanning and control lines from the signal lines;
  switching elements, each of which is arranged in a vicinity of a respective intersection of the scanning and signal lines and has a first electrode terminal electrically connected with respective one of the signal lines; and
  island metal patterns, each of which is arranged to at least partly overlap the control line and is electrically connected with a second electrode terminal of the respective switching element;

forming a second insulator film that covers the multi-layer wiring pattern;

forming pixel electrodes on the second insulator film, which are arranged in a matrix form and each of which is electrically connected to the second electrode terminal of the respective switching element;

checking of electrical continuity of each of the signal lines before forming the second insulator film, to find out a wiring breakage that separates one of the signal lines into two wiring parts;

forming first and second bridge wirings that run respectively from said wiring parts to one of the island metal patterns, which is adjacent to the wire breakage, if and when the wire breakage is found out at said checking; and forming semiconductor island patterns arranged at underneath of the control lines and an insulator film covering the semiconductor island patterns before the forming of the control lines, wherein fringes of the semiconductor island patterns are covered by the control lines at least in vicinity of the bridge wirings.

* * * * *